United States Patent [19]
Kot

[11] Patent Number: 5,901,182
[45] Date of Patent: May 4, 1999

[54] METRIC SIFTING IN BREADTH-FIRST DECODING OF CONVOLUTIONAL CODED DATA

[75] Inventor: Alan D. Kot, Vancouver, Wash.

[73] Assignee: Sharp Laboratories of America, Inc., Camas, Wash.

[21] Appl. No.: 08/824,417

[22] Filed: Mar. 26, 1997

[51] Int. Cl.[6] .......................... H04L 27/06; H04L 23/02; G06F 11/10

[52] U.S. Cl. ......................... 375/341; 375/265; 371/43.7; 371/43.8

[58] Field of Search ................................. 375/262, 265, 375/341; 371/43.4, 43.6, 43.7, 43.8

[56] References Cited

U.S. PATENT DOCUMENTS

| | | |
|---|---|---|
| 3,457,562 | 7/1969 | Fano . |
| 4,500,994 | 2/1985 | McCallister et al. . |
| 4,933,956 | 6/1990 | Forney, Jr. . |
| 5,229,767 | 7/1993 | Winter et al. . |
| 5,291,499 | 3/1994 | Behrens et al. . |
| 5,327,439 | 7/1994 | Estola et al. . |
| 5,384,810 | 1/1995 | Amrany . |
| 5,406,570 | 4/1995 | Berrou et al. . |
| 5,502,735 | 3/1996 | Cooper . |
| 5,539,757 | 7/1996 | Cox et al. . |
| 5,588,028 | 12/1996 | Parizhsky . |

OTHER PUBLICATIONS

Forney Jr., G.D., "The Viterbi Algorithm," Proc. IEEE, vol. 61, pp. 268–278, Mar. 1973.

Wolf, J.K., "Efficient maximum likelihood decoding of linear block codes using a trellis," IEEE Trans. Inform. Theory, vol. IT–24, No. 1, pp. 76–80, Jan. 1978.

Anderson, J.B. and Mohan, S., "Sequential decoding algorithms: A survey and cost analysis," IEEE Trans. Commun., vol. COM–32, No. 2, pp. 169–176, Feb. 1984.

Fano, R.m., "A heuristic discussion of probabilistic decoding," IEEE Trans. Inform. Theory, vol. IT–9, pp. 64–74, Apr. 1963.

Anderson, J.B. and Mohan, S., "Architectures for Coding Algorithms," Chapter 7, Coding: An Algorithmic Approach, Kluwer, pp. 365–379, 1990.

Mohan, S. and Sood, A. K., "A multiprocessor architecture for the (M,L)–algorithm suitable for VLSI implementation," IEEE Trans. Commun., vol. COM–34, No. 12, pp. 1218–1224, Dec. 1986.

Simmons, S.J., "A nonsorting VLSi structure for implementing the (M,L) algorithm," IEEE J. Selected Areas Commun., vol. JSAC–6, pp. 538–546, Apr. 1988.

Kot, A.D., "A linear–time method for contender sifting in breadth–first decoding of error control codes," 1993 Canadian Conference on Electrical and Computer Engineering, Vancouver Canada, Sep. 1993, (Kot 93).

Knuth, D.E., The Art of Computer Programming: vol. III, Sorting and Searching, Addison Wesley, pp. 208–215, 1973.

Simmons, S.J., "Breadth–first decoding with adaptive effort," IEEE Trans. Commun., vol. COM–38, No. 1, pp. 3–12, Jan. 1990.

(List continued on next page.)

Primary Examiner—Temesghen Ghebretinsae
Assistant Examiner—Albert Park
Attorney, Agent, or Firm—Marger Johnson & McCollom, P.C.

[57] ABSTRACT

A metric sifting, i.e., sorting or selection, method which can efficiently provide a sorted set of survivor metrics during breadth-first reduced-search decoding of convolutional codes. The preferred embodiment efficiently implements the M algorithm by providing a sorted set of M survivor metrics using a linear-time (O(M)) number of comparisons. To obtain this efficiency, the method employs partitioning of branch metrics into implicitly sorted subsets, and employs efficient merging of these subsets. Compared to the prior art, the number of comparisons for metric sifting during M algorithm decoding of typical rate 1/n binary convolutional codes is reduced by 30–40%; more specifically, the number of comparisons is reduced from $(2n-1)M-(n-1)$ to $n(M-1)+2^n-1$.

15 Claims, 4 Drawing Sheets

OTHER PUBLICATIONS

Kot, A.D., On the Construction, Dimensionality, and Decoding of Linear Block Code Trellises, Ph.D. Thesis, University of British Columbia, Dec., 1992.

Lin, C. F. and Anderson, J. B., "M–algorithm decoding of channel convolutional codes," Conf. on Information Science and Systems, Princeton University, Princeton, New Jersey, pp. 362–366, Mar. 1986.

Benelli, G. and Fantacci, R., "New detection algorithm with reduced complexity," IEE Proc., vol. 137, Pt. 1, No. 1, pp. 47–59, Feb. 1990.

Lee, W–T.; Chan, M–H.; Chen, L–G., and Lin, M–C., "A single–chip Viterbi decoder for a binary convolutional code using an adaptive algorithm," IEEE Trans. Consumer Electronics, vol. 41, No. 1, Feb. 1995.

METRIC SIFTING IN BREADTH-FIRST DECODING OF CONVOLUTIONAL CODED DATA

BACKGROUND OF THE INVENTION

This invention relates generally to a reduction in the computational effort of decoding error control codes, and more particularly to an improved method of breadth-first decoding of convolutional codes.

In digital communication systems, it is commonplace to use error control codes to maintain reliable data reception. Error control coding adds redundancy to a sequence of symbols, and at the receiver this redundancy is used to correct errors in the noisy received sequences.

Error control codes have traditionally been divided into two categories, namely block codes and convolutional codes. In a block code, k information symbols are encoded into a larger block of n code symbols, to produce a rate k/n code. In a convolutional code, an ongoing stream of information symbols is continuously encoded, with a code rate of k/n being produced by repeatedly shifting k information symbols into a shift register, and for each set of k information symbols the encoder produces n code symbols based on the information symbols in the shift register and the encoder structure.

Regardless of whether the coding is block or convolutional, the vast majority of the computational effort occurs at the decoder, whose task is to estimate which coded symbol sequence best corresponds to the received noisy sequence of symbols. A well known decoder is the Viterbi algorithm (VA), which produces a maximum-likelihood sequence estimate and is thus optimal (in the sense of minimizing the probability of sequence error, given equally likely occurring information sequences). The VA was first used in the context of convolutional codes, then for intersymbol interference sequence estimation, and more recently in the context of decoding block codes. For background information on the VA and its applications the reader is referred to G. D. Forney Jr., "The Viterbi algorithm," Proc. IEEE, vol. 61, pp. 268–278, 1973., and J. K. Wolf, "Efficient maximum likelihood decoding of linear block codes using a trellis," IEEE Trans. Inform. Theory, vol. IT-24, pp. 76–80, January 1978. Use of the Viterbi Algorithm and its derivatives is not limited, however, to digital communications; it can be used in other probabilistic decision-making or pattern-matching processes, for example, speech or character recognition or decoding in computer peripheral storage devices.

Unfortunately, the computational complexity of the VA can be one of the most significant computational loads in a receiver. The VA's computational effort arises from the fact that it performs a search of all the paths through a potentially large trellis diagram. In this trellis, the branches represent the allowable sequences in the code, and the nodes represent the possible encoder states (e.g. shift register contents, in the case of a convolutional code). The width of the trellis (in terms of the number of possible encoder states) depends exponentially on the memory of the code (e.g. the shift-register length, in the case of a convolutional code). A large computational load is disadvantageous for many applications, such as digital cellular telephones which rely on battery power, and for applications that require very high speed decoding.

Consequently, efforts have been made towards obtaining improved trade-offs between coding performance and complexity. Some of these efforts have gone towards improving the efficiency of implementing maximum-likelihood decoders such as the VA, while other approaches use sub-optimal (non-maximum-likelihood) decoders to hopefully obtain greater reductions in complexity. Various sub-optimal decoding schemes are summarized in the literature; for example, see J. B. Anderson and S. Mohan, "Sequential decoding algorithms: A survey and cost analysis," IEEE Trans. Commun., vol. COM-32, pp. 169–176, February 1984. These approaches include the stack algorithm, the Fano algorithm (see R. M. Fano, "A heuristic discussion of probabilistic decoding," IEEE Trans. Inform. Theory, pp. 64–74, April 1963; and U.S. Pat. No. 3,457,562), and breadth-first decoding schemes such as the M-algorithm.

By breadth-first, we mean that the decoding search extends paths through a code tree (or trellis, which is a more compact representation of the code tree) where all of the paths in storage are of the same length. The VA is a breadth-first search, and it searches the entire trellis. The M algorithm is also a breadth-first search, but in the M algorithm only the best M paths are retained at each depth in the tree (or trellis). Breadth-first partial searches of a code tree have are particularly attractive in that they are inherently parallel, which facilitates implementation in parallel hardware. For more details on the M algorithm, the reader is referred to J. B. Anderson and S. Mohan, Coding: An Algorithmic Approach, Kluwer, 1990, and S. Mohan and A. K. Sood, "A multiprocessor architecture for the (M,L)-algorithm suitable for VLSI implementation," IEEE Trans. Commun., vol COM-34, pp. 1218–1224, December 1986.

The most significant computational bottleneck in M algorithm decoding of error control codes has been the task of finding the best M metrics at each depth in the tree (or trellis). We refer to this task as metric sifting. In A. D. Kot, "A linear-time method for contender sifting in breadth-first decoding of error control codes," 1993 Canadian Conference on Electrical and Computer Engineering, Vancouver Canada, September 1993, (Kot 93) a method is described that can provide a sorted set of metrics during M algorithm decoding of binary linear block codes using only M comparisons. This is a significant improvement over comparison-based sorting, which requires $O(M\log_2 M)$ comparisons. This is also a significant improvement over Hadian and Sobel's comparison-based selection method (see D. E. Knuth, The Art of Computer Programming: Volume III, Sorting and Searching, Addison Wesley, 1973) where the best metrics are found without regard to order. An example of a non-comparison-based method is reported in S. J. Simmons, "A nonsorting VLSI structure for implementing the (M,L) algorithm," IEEE J. Selected Areas Commun., Vol. JSAC-6, pp. 538–546, April 1988., which cannot be directly and fairly compared since the types of operations are dissimilar.

The efficiency of the metric sifting method reported in Kot93 arises from exploiting an ordering that is inherent in the metrics. The method for binary linear block codes can be briefly summarized as follows. Imagine that there are M paths (survivors) in a code tree search whose metrics are extended to form 2M metrics. The task is to sift out the best M metrics from among these 2M metrics. Assume that the M metrics prior to extension were available in sorted order. The method proceeds by organizing the 2M extended metrics into two subsets, where one subset corresponds to extension by a 0 bit, and the other corresponds to extension by a 1 bit. It is shown in Kot93 (in particular, FIG. 3) that this organization preserves metric order within each subset. The already ordered subsets are then merged (which is much more efficient than sorting) to provide a sorted set of M survivor metrics.

The metric sifting method of Kot93 is also applicable to decoding convolutional codes. In the application of merge sifting to convolutional codes, the method described in Kot93 for merging two subsets and repeating for each of the n bits in a branch, will be referred to as Bit-by-Bit Merge Sifting. It is applicable to both binary block codes and convolutional codes but is about one-third as computationally efficient for rate ½ convolutional codes as for block codes.

Accordingly, a need remains to further improve the efficiency of breadth-first decoding of convolutional codes.

SUMMARY OF THE INVENTION

The object of the present invention is to reduce the complexity of metric sifting during breadth-first decoding of convolutional codes.

For the purposes of the present invention, convolutional codes are characterized merely by having n bits per branch, where n is an integer greater than 1. Our discussion will consider only such rate 1/n codes, since these are the most popular and since higher rate codes are commonly constructed by a technique known as puncturing.

Instead of Bit-by-Bit Merge Sifting, where n stages of merging two subsets are used, the present invention uses a single stage of merging $2^n$ subsets. The $2^n$ subsets are formed by partitioning the branch metrics according to their n-bit branch label. We will refer to this technique as Branch Merge Sifting. It may appear counter-intuitive that merging $2^n$ subsets in one stage would be more efficient than merging only two subsets in n stages. In Bit-by-Bit Merge Sifting, however, some stages must merge sets that are twice as large as in the Branch Merge Sifting approach. Specifically, in Bit-by-Bit Merge Sifting, there are 2M variables to be merged at each of the first n–1 bits, except for a final, smaller merging to obtain M survivors. The branch merging approach avoids all of the n–1 larger merging steps, although at a cost of using more subsets. The efficiency of this trade-off is influenced by the efficiency of the multiple set merging, which can be implemented by various means. Means are discussed to efficiently perform the multiple set merging, for an overall improvement in the efficiency compared to Bit-by-Bit Merge Sifting.

More specifically, the invention includes a method for metric sifting during breadth-first decoding of rate 1/n convolutional coded binary data using a partial search of a trellis or tree, in which a plurality M of paths are retained at the end of each branch-decoding stage. Within each stage of the method $2^n$ branch metrics are formed that correspond to the $2^n$ possible labels of an n-bit branch. Each of the M path metrics are extended to form 2M metrics, where each extension uses the branch metric for its extended branch. In this path metric extension, a path metric is updated by simply adding the branch metric that corresponds to the branch label. The resulting set of 2M metrics is grouped into $2^n$ subsets according to the n-bit label of the extended branch. The 2M metrics in the subsets are merged to form a sorted output set containing the best M metrics from among the 2M metrics in the subsets. These best M metrics, and their corresponding branch labels, are used to update the paths in storage for this decoding stage. These M paths and corresponding metrics are used as inputs to the next branch-decoding stage of the method.

Within each branch decoding stage, or cycle, the merging step can be carried out by comparing the best metric from each one of said $2^n$ subsets of said metrics to select the best remaining unmerged metric from among said subsets. This can be accomplished by a series of two-way comparisons, among all 2M metrics, but preferably a binary tree-based merging method is used. In this method, the best metrics from pairs of the $2^n$ metric subsets are compared, and only those comparisons need to be carried out at nodes in the binary comparison tree that connect the metric subset that most recently provided a metric to the output set.

These methods enable substantially less computation to sift the metrics in breadth-first decoding of convolutional codes.

The foregoing and other objects, features and advantages of the invention will become more readily apparent from the following detailed description of a preferred embodiment of the invention which proceeds with reference to the accompanying drawings.

DETAILED DESCRIPTION

The present invention employs an improved method for searching a code trellis (or tree) in connection with the decoding of convolutional codes. A reduced search is used to reduce the computational load and thereby lead to reduced power consumption, which is particularly advantageous in portable devices such as telephones, and can also reduce the complexity and area of integrated computational circuitry. The reduced search algorithm of the present invention employs an improvement of the merge sifting method described in Kot93, in order to further reduce the computational load of decoding convolutional codes by decreasing the number of comparisons needed to decode such codes.

Figure 1:
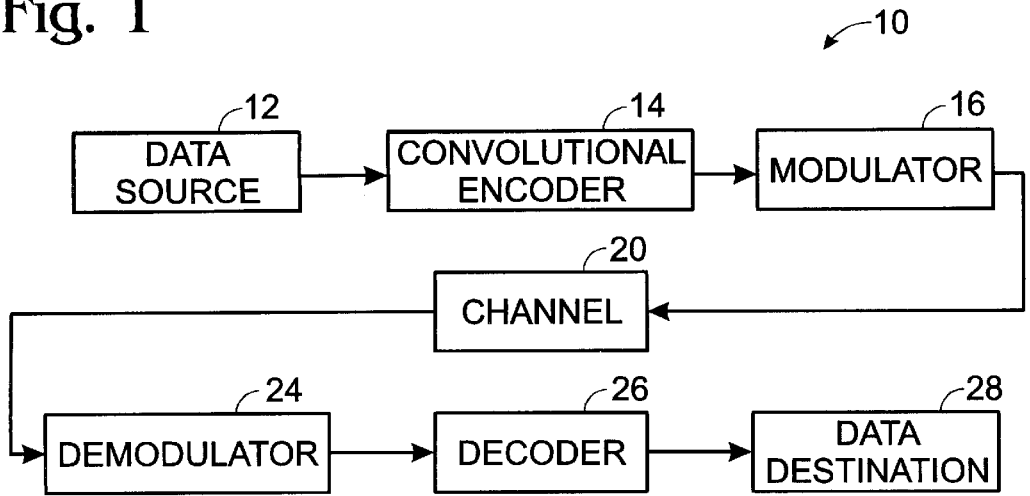
FIG. 1 is a block diagram of a simplified digital data communications system in which the present invention is implemented.

Referring to FIG. 1, a simplified representation of a data communications system 10 includes a data source 12, a convolutional encoder 14 and a modulator 16. The data source can be either an origin of digital data, such as a computer, or can be a transducer with analog-to-digital conversion circuitry, as in the case of a voice input to a cellular telephone. Modulated digital data is transmitted over a channel 20 to a receiver, which includes a demodulator 24, a decoder 26, according to the present invention, and a data destination 28. In general, the channel is noisy and may be time-varying, such as a mobile radio channel. The channel can take other forms, however, for example, magnetic storage media used for storing digital data in a computer.

The demodulator 24 provides soft decisions to the decoder 26. Soft decisions are tentative symbol decisions accompanied by decision reliability information. With binary symbols, the soft decisions may take the form of a signed-magnitude value, where the sign indicates the tentative bit decision, and the magnitude indicates the decision reliability (log-likelihood ratio). It is also possible to use hard decisions (which can be considered to be binary-quantized soft-decisions), at some loss in performance. In general, the soft-decisions may be represented in many forms. Regardless of the exact form used for the soft-decision metrics, the term best metric will naturally be understood to indicate the most likely metric.

Figure 2:
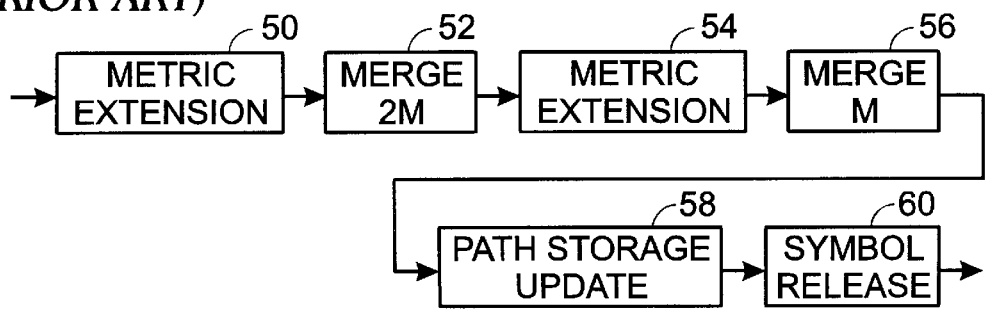
FIG. 2 is a block diagram of the prior art Bit-by-Bit Merge Sifting method, showing the decoding operations for decoding one branch.

FIG. 2 is a block diagram of the prior art Bit-by-Bit Merge Sifting method, showing the decoding operations for decoding one branch of a rate ½ convolutional code. The Bit-by-Bit Merge Sifting method processes an n-bit branch in n stages. In this example, n=2.

Figure 4:
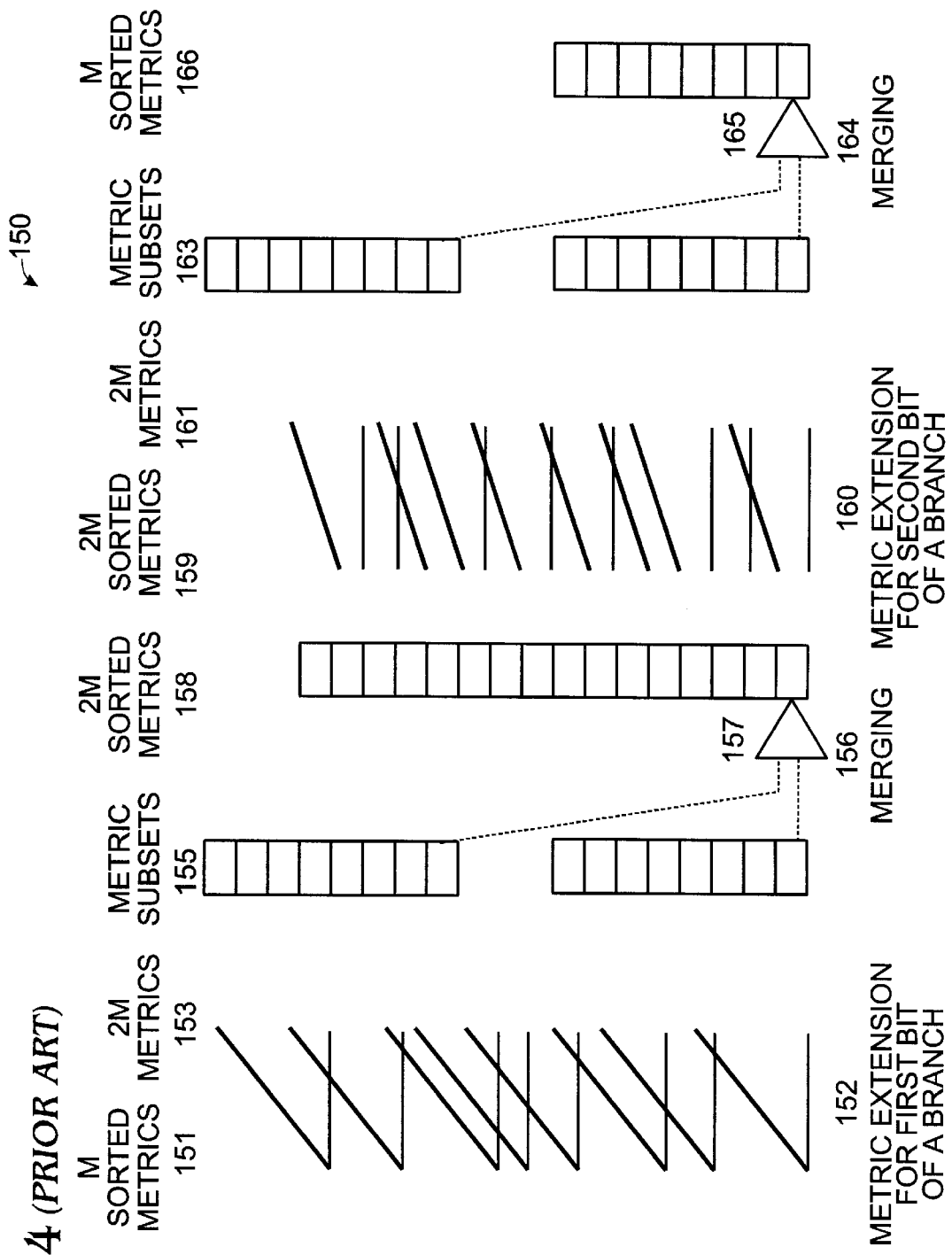
FIG. 4 is a more detailed representation of the metric processing operations carried out in the prior art merge sifting method of FIG. 2.

The soft-decisions are input from the demodulator 24 to a metric extender 50, which forms two metrics that correspond to using only one bit of a n-bit branch, extending the M path metrics using these (one-bit-branch) metrics, and grouping the metrics into two subsets according to whether the extended bit is a zero or a one. This operation is shown more in detail at 152 in FIG. 4, where M metrics 151 are extended to form 2M metrics 153 in two metric subsets 155. Note that because of this arrangement of the metrics into subsets, each metric subset 155 has sorted metrics.

The merge block 52 in FIG. 2 merges the metric subsets produced by the metric extender 50 and consequently forms a sorted set. This operation is shown in more detail at 156 in FIG. 4, where a two-input comparator 157 selects the best (e.g., lowest in distance) metric from between the two subsets. Note that each input to comparator 157 is the lowest remaining unmerged metric in a subset. Note also that the output of comparator 157 is placed in the next available spot in the output set of sorted metrics 158. These storing operations can be implemented using in-place metric storage, using pointers to reference the metrics, or non-in-place metric storage, for example, using shift registers for the metric subsets to provide the appropriate metrics to comparator 157, and to provide for the proper placement of metrics in an output shift register.

The metric extender 54 in FIG. 2 is identical to the metric extender 50. However, it produces a set of 2M metrics from 2M input metrics, rather than from an input set of M metrics. This difference arises from the fact that the second or subsequent bits of the n bits on a convolutional code branch are constrained (or parity), i.e. they are not freely-chosen information bits. The extension of 2M metrics for the second bit of a rate ½ code is shown at 160 in FIG. 4.

The merge block 56 in FIG. 2 merges the metric subsets produced by the metric extender 54. This operation is shown more detail at 164 in FIG. 4, and is similar to that described for the merging operation 156, except that only M of the 2M inputs are merged to provide M sorted metrics as survivors.

The path storage update block 58 in FIG. 2 updates the storage of M surviving paths according to the extension and sifting just carried out. The path storage can be of any equivalent means, such as storing the sequence of states, or the sequence of information bits.

The symbol release block 60 in FIG. 2 releases an output symbol, after an appropriate decoding delay. The decoding delay is typically taken to be several constraint lengths, as is well known in the art. As well, there are various means, well known in the art, for deciding which symbol to release after the decoding delay.

The general theory of operation of M algorithm decoding, including the hardware and software implementation of it, are described in the prior art and need not be described in further detail herein.

As just described, in the prior art Bit-by-Bit Merge Sifting method for rate 1/n convolutional codes, each branch is viewed as the concatenation of n single-bit branches, and a n-stage metric extension and merging method is used that employs two metric subsets. As well, there are 2M metrics to be merged at each of the first n−1 bits, except for a final smaller merging to obtain M survivors. While this approach can be highly efficient for merge sifting of binary block codes, it requires approximately three times more computations for rate ½ convolutional codes.

Figure 3:
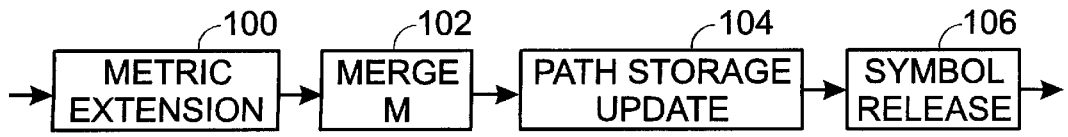
FIG. 3 is a block diagram of the Branch Merge Sifting method according to the invention, showing the decoding operations for decoding one branch, and which forms part of the decoder of FIG. 1.

Instead of Bit-by-Bit Merge Sifting, the present invention utilizes a single metric extension stage and a single merging stage, as shown in FIG. 3. The metric extender 100 forms $2^n$ metrics that correspond to using all n bits of an n-bit branch, and extends the M path metrics using the n-bit-branch metrics, and groups the metrics into $2^n$ subsets according to the n-bit label of the extended branch.

Figure 5:
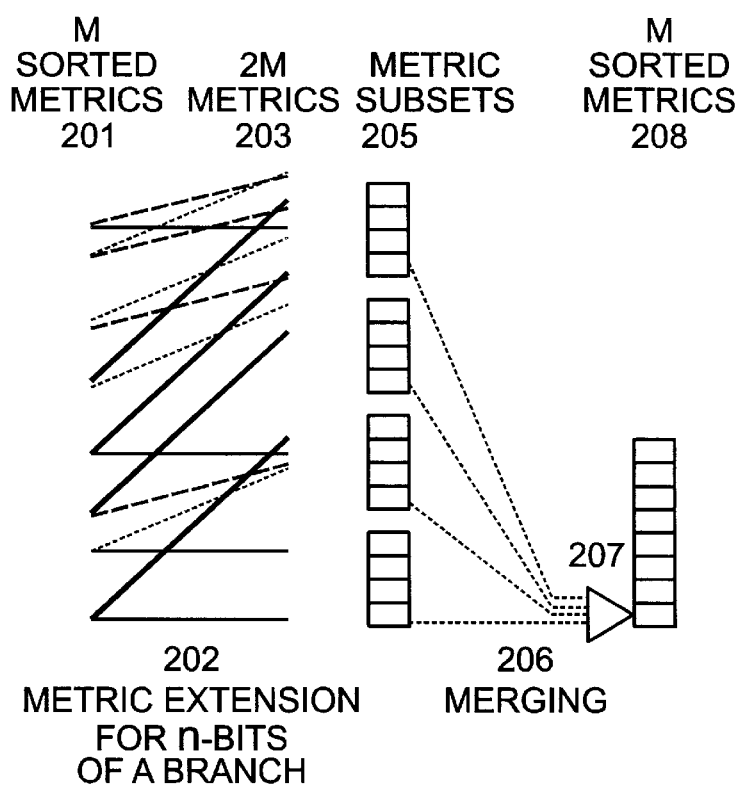
FIG. 5 is a more detailed representation of the metric processing operations that are carried out in the Branch Merge Sifting method of FIG. 3, using a direct merging procedure.

This operation is shown more detail at 202 in FIG. 5 for an example rate ½ code (n=2), where M metrics 201 are extended by n-bit branches to form 2M metrics 203 in four metric subsets 205. In this example, there are four possible values for the branch labels (namely 00, 01, 10, 11) and consequently there are four possible branch metrics shown at 202. Note that because of the arrangement of the metrics into the four subsets, each metric subset 205 has sorted metrics. The path storage update block 104 and the symbol release block 106 operate as described above for blocks 58 and 60 respectively.

It may seem counter intuitive that merging a larger number of subsets would be more efficient than merging just two subsets as in Bit-by-Bit Merge Sifting. However, the drawback of Bit-by-Bit Merge Sifting is that there are more stages and that half or more of these stages have to merge sets that are twice as large. The branch merging approach of the present invention avoids n−1 of the larger merging steps required in bit-by-bit merging, albeit at a cost of using more subsets.

One procedure for implementing the merge block 102 in FIG. 3 is shown in FIG. 5 at 206. This procedure will be referred to as Direct Branch Merging, and it uses a $2^n$-input comparator 207 to select the lowest metric from between the $2^n$ subsets. This comparator can be realized as a series of $2^n-1$ 2-input comparisons.

We can upper bound the number of comparisons for the Direct Branch Merge Sifting method as follows. We first discuss the number of computations for n=2 (i.e. rate ½ codes), and then extend the result to larger n.

For n=2, there are four metric subsets and the extension of M survivors will lead to 2M contenders, with these contenders partitioned in some manner among 4, 3, or 2, subsets. The partitioning depends on the code, the metrics, and M. (Also, the reason that there are always at least two subsets is that the branches extended from each node necessarily include 0 and 1 for the information bits, and so must lead to at least two subsets.)

Recall that the task is to merge the lowest M elements from among the subsets, by making a comparison among the smallest remaining element from each subset. Next, consider that decreasing the number of subsets can only decrease (or leave the same) the number of comparisons. (To prove this, assume that the opposite is true, i.e., that reducing the number of subsets can only increase the number of comparisons. However, this is false, since the extension to the case of 1 subset would then have the most comparisons, where in fact exactly zero comparisons are required in this case.) Consequently, the largest number of comparisons will be for the largest number of subsets, i.e. 4 subsets for n=2. Next, consider that for any given number of subsets, the most comparisons will be made for an equal number of elements in each subset. This follows by considering that having an equal distribution of elements is sufficient to ensure that the largest number of elements from any subset must be merged before any subset is emptied, and after that we have a smaller number of subsets, which reduces the number of comparisons, as just discussed. In summary, the largest number of comparisons occurs for $2^n$ subsets (with an equal partitioning of the 2M contenders into $(2M)/2^n = M/2^{n-1}$ elements per subset). We can find the next element to merge from among the $2^n$ subsets using $2^n - 1$ comparisons. Thus, we can upper bound the number of comparisons to find M survivors as $$N_{C2} \leq M(2^n - 1)$$

(1)

for the Direct Branch Merge Sifting method.

As a reference for comparison recall from Kot 93 that the number of comparisons for Bit-by-Bit Merge Sifting is $$N_1 \leq M(2n-1)-(n-1).$$

(2)

Figure 6:
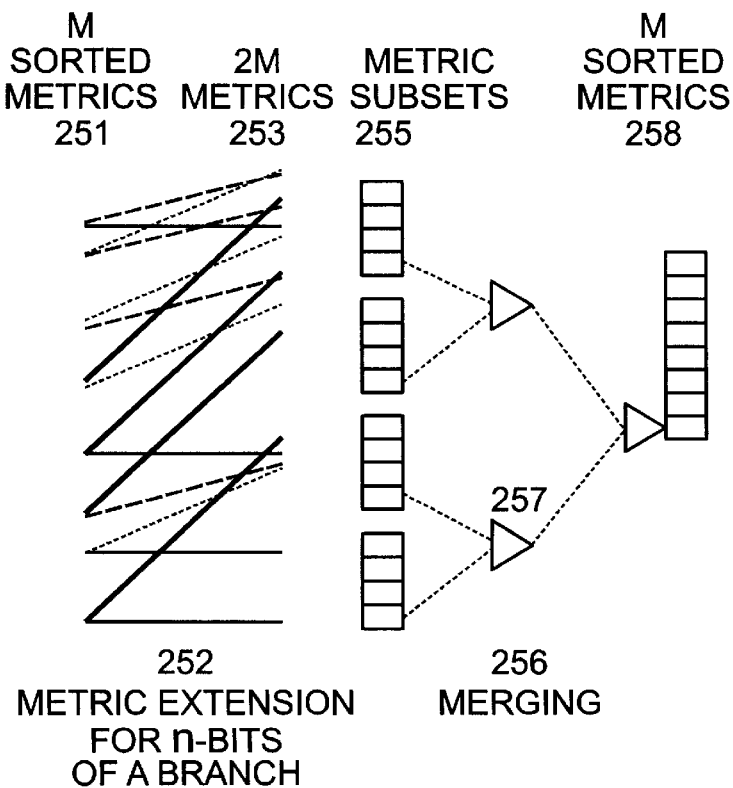
FIG. 6 provides a more detailed representation of the metric processing operations that are carried out in the Branch Merge Sifting method of FIG. 3, using a binary-tree merging procedure.

Another procedure for implementing the merge block 102 in FIG. 3 is shown in FIG. 6 at 256. This procedure will be referred to as Binary-Tree Branch Merge Sifting, and it uses a binary-tree arrangement of 2-input comparison operations to select the lowest metric from between the $2^n$ subsets.

In this procedure, the first step is to perform an initial set of comparisons at all of the comparators in the binary tree. There are $2^n - 1$ such comparisons. The next step is to take the best (e.g., lowest distance) metric indicated by these comparisons and put this metric into the output set. This step also exposes the next metric in that subset. The next step, and all subsequent steps, involve "updating" (or recomputing) the comparisons in the tree, then moving the lowest remaining unmerged metric into the output. To do the updating, note that when a new metric is exposed in a subset, we need only make comparisons at nodes in the tree that lead from that subset to the final node. In other words, this procedure uses a binary tree-based comparison of the best metrics from the metric subsets in which only those comparisons need to be carried out at nodes in the binary comparison tree that connect the metric subset that most recently provided a metric to the output set.

The number of comparisons involved for this step is exactly the depth of the tree, i.e. n comparisons. Thus, to merge M survivors, there are at most (M−1)n comparisons for these steps, plus the initial number of comparisons in the whole tree, which is $2^n - 1$, giving a total number of comparisons of $$N_{C3} \leq (M-1)n + 2^n - 1, M \geq 4$$

(3)

for the Binary-Tree Branch Merge Sifting method.

Table 1 summarizes the expressions of the upper bound number of comparisons for the Bit-by-Bit, Direct Branch, and Binary-Tree Merge Sifting methods, for the important cases of n=2, 3, 4.

For n=2 (rate ½ coding), we see from Table 1 that Direct Branch Merge Sifting uses essentially the same number of comparisons as Bit-by-Bit Merge Sifting (keep in mind that M is typically much greater than 1). We also see that Binary-Tree Branch Merge Sifting saves approximately ⅓ of the number of comparisons.

For n=3, (rate ⅓), we see from Table 1 that Branch Merge Sifting has increased to save roughly 40% of the number of comparisons.

TABLE 1

| Upper Bounds on the Number of Comparisons to Sift M from 2M Contenders | | | |
|---|---|---|---|
| | n = 2 | n = 3 | n = 4 |
| Bit-by-bit Merging | M(2n − 1) − (n − 1) | 3M − 1 | 5M − 2 | 7M − 3 |
| Branch Merging (Direct) | M($2^n$ − 1) | 3M | 7M | 15M |
| Branch Merging (Binary Tree) | ((M − 1) n + $2^n$ − 1) | 2M + 1 | 3M + 4 | 4M + 11 |

Figure 7:
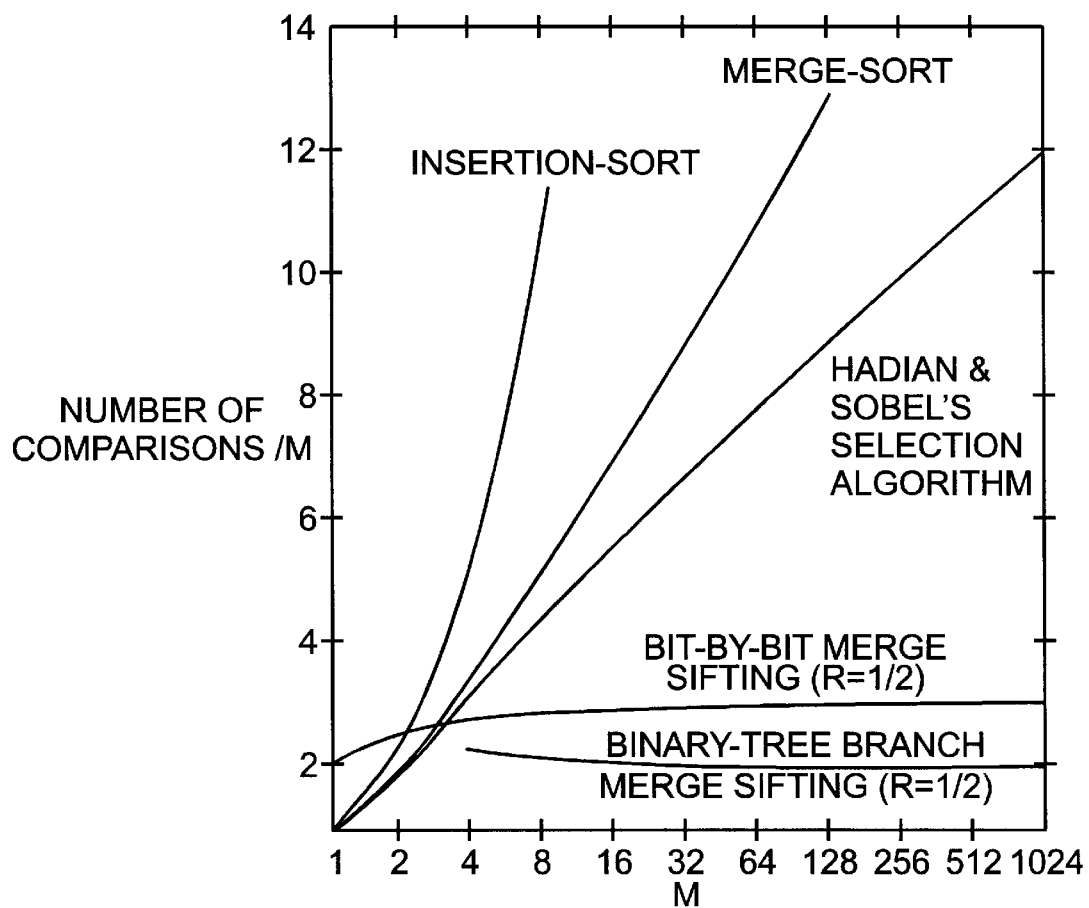
FIG. 7 is a graph showing the relative efficiency of the present invention, compared to some prior art methods that use comparison-based merge sifting.

FIG. 7 helps to put this sorting effort in perspective versus some comparison-based sifting methods known before the introduction of Merge Sifting. FIG. 7 shows the number of comparisons normalized by M, for a rate ½ code using Bit-by-Bit Merge Sifting, and for Binary-Tree Branch Merge Sifting. FIG. 7 also shows the effort required for some previous comparison-based schemes, namely; insertion sorting, merge-sort, and Hadian and Sobel's selection algorithm (discussed in D. E. Knuth, "The Art of Computer Programming: Volume III, Sorting and Searching," Addison Wesley, 1973). Bit-by-Bit Merge Sifting does considerably better than merge-sorting (which is an asymptotically optimal sorting scheme) and Hadian and Sobel's selection algorithm (which is not straightforward to implement). For convolutional codes, Binary Tree Branch Merge Sifting according to the invention provides a substantial further improvement over Bit-by-Bit Merge Sifting.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. A method for metric sifting during breadth-first decoding of rate 1/n convolutional coded binary data using a partial search of a trellis or tree, in which a plurality M of paths and associated M path metrics are retained in storage at the end of each branch-decoding stage, each stage of the method comprising:

forming $2^n$ branch metrics that correspond to $2^n$ possible labels of an n-bit branch, n being an integer greater than 1, extending each of the M path metrics to form 2M metrics, each extension using a branch metric that corresponds to the extended n-bit branch;

grouping the 2M metrics into $2^n$ subsets according to the n-bit label of the extended n-bit branch;

merging the metrics to form a sorted output set containing M metrics which are the best M metrics from among the 2M metrics in the subsets;

updating each of the M paths in storage with its corresponding metric from among said best M metrics; and concatenating with each of the M paths in storage its extended n-bit branch label.

2. A method according to claim 1 in which the merging step includes comparing the best metric from each one of said $2^n$ subsets of said metrics to select the best remaining unmerged metric from among said subsets.

3. A method according to claim 1 in which the merging step includes two-way comparisons of the best metric from each one of said $2^n$ subsets of said metrics to select the best remaining unmerged metric from each pair of subsets.

4. A method according to claim 1 in which the merging step includes a binary tree-based comparison of the best metrics from pairs of said $2^n$ subsets of said metrics in which only those comparisons need to be carried out at nodes in the binary comparison tree that connect the metric subset that most recently provided a metric to the output set.

5. A method according to claim 1 in which the extending step is performed in a single metric extension stage and the merging step is performed in a single merging stage.

6. A method according to claim 1 in which the metrics in each subset are ordered from a lowest to highest value of the metrics.

7. A method according to claim 1 in which a sorted set of M metrics is input to each stage, the step of grouping the 2M branch metrics according to the n-bit label of the extended branch maintaining the order of the metrics so that each the subsets of the 2M extended metrics are sorted, and the step of merging the best metrics from the sorted subsets producing the sorted output set containing M metrics.

8. A decoder for breadth-first decoding of rate 1/n convolutional coded binary data using a partial search of a trellis or tree, in which a plurality M of paths are retained at the end of each branch-decoding stage, the decoder including a metric sifting apparatus comprising:

means for forming $2^n$ branch metrics that correspond to the $2^n$ possible labels of an n-bit branch, n being an integer greater than 1, means for extending each of the M path metrics to form 2M metrics, each extension using a branch metric that corresponds to the extended n-bit branch;

means for grouping the 2M metrics into $2^n$ subsets according to the n-bit label of the extended n-bit branch;

means for merging the metrics to form a sorted output set containing M metrics which are the best M metrics from among the 2M metrics in the subsets;

means for updating each of the M paths in storage with its corresponding metric from among said best M metrics; and means for concatenating with each of the M paths in storage its extended n-bit branch label.

9. A decoder according to claim 8 in which the means for merging includes means for comparing the best metric from each one of said $2^n$ subsets of said metrics to select the best remaining unmerged metric from among said subsets.

10. A decoder according to claim 8 in which the means for merging includes a comparator for making two-way comparisons of the best metric from each one of said $2^n$ subsets of said metrics to select the best remaining unmerged metric from each pair of subsets.

11. A decoder according to claim 8 in which the means for merging includes a binary tree-based comparator operative to select the best metrics from pairs of said $2^n$ subsets of the metrics and arranged so that only those comparisons need to be carried out at nodes in the binary comparison tree that connect the metric subset that most recently provided a metric to the output set.

12. A decoder according to claim 8 in which the extending means consists of a single metric extension stage and the merging means consists of a single merging stage.

13. A decoder according to claim 8 in which the metrics in each subset are ordered from a lowest to highest value of the metrics.

14. A decoder according to claim 8 in which a sorted set of M metrics is input to each stage, the means for grouping the 2M branch metrics according to the n-bit label of the extended branch being operative to maintain the order of the metrics so that each the subsets of the 2M extended metrics are sorted, and the means for merging the best metrics from the sorted subsets producing the sorted output set containing M metrics for input to a next stage.

15. A data communication or data storage system comprising:

a source of 1/n convolutional coded binary data, n being an integer greater than 1;

a transmitter transmitting the convolutional coded binary data over a communication or data storage channel; and a receiver including a decoder for breadth-first decoding of rate 1/n convolutional coded binary data using a partial search of a trellis or tree, in which a plurality M of paths are retained after each branch-decoding stage, the decoder including a metric sifting apparatus comprising:

means for forming $2^n$ branch metrics that correspond to the $2^n$ possible labels of an n-bit branch, n being an integer greater than 1, means for extending each of the M path metrics to form 2M metrics, each extension using a branch metric that corresponds to the extended n-bit branch;

means for grouping the 2M metrics into $2^n$ subsets according to the n-bit label of the extended n-bit branch;

means for merging the metrics to form a sorted output set containing M metrics which are the best M metrics from among the 2M metrics in the subsets;

means for updating each of the M paths in storage with its corresponding metric from among said best M metrics; and means for concatenating with each of the M paths in storage its extended n-bit branch label.

* * * * *